(12) United States Patent
Sugiyama et al.

(10) Patent No.: US 11,105,752 B2
(45) Date of Patent: Aug. 31, 2021

(54) INSPECTING APPARATUS AND PROCESSING APPARATUS INCLUDING THE SAME

(71) Applicant: DISCO CORPORATION, Tokyo (JP)

(72) Inventors: Tomoaki Sugiyama, Tokyo (JP); Hirohiko Kozai, Tokyo (JP); Naoki Morikawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/837,067

(22) Filed: Apr. 1, 2020

(65) Prior Publication Data
US 2020/0333261 A1 Oct. 22, 2020

(30) Foreign Application Priority Data
Apr. 16, 2019 (JP) .............................. JP2019-077853

(51) Int. Cl.
*G01N 21/95* (2006.01)
*G01T 7/04* (2006.01)
*G06T 7/00* (2017.01)
*G01N 21/01* (2006.01)

(52) U.S. Cl.
CPC ....... *G01N 21/9501* (2013.01); *G06T 7/0004* (2013.01); *G01N 2021/0106* (2013.01); *G06T 2207/30148* (2013.01)

(58) Field of Classification Search
USPC ......................................................... 348/87
See application file for complete search history.

(56) References Cited

U.S. PATENT DOCUMENTS

| 6,342,434 | B1 * | 1/2002 | Miyamoto | ........... | G06K 19/077 |
| | | | | | 438/464 |
| 2001/0044256 | A1 | 11/2001 | Sekiya | | |
| 2010/0022166 | A1 * | 1/2010 | Kimba | .................... | B24B 49/12 |
| | | | | | 451/5 |

FOREIGN PATENT DOCUMENTS

| JP | 2010087141 A | 4/2010 |
| JP | 2018166178 A | 10/2018 |
| KR | 1020160003608 A | 1/2016 |
| TW | 200523538 A | 7/2005 |

OTHER PUBLICATIONS

Singapore Application No. 10202002976X Search Report, dated Mar. 10, 2021 (4 pages).

* cited by examiner

*Primary Examiner* — Mikhail Itskovich
(74) *Attorney, Agent, or Firm* — Greer, Burns & Crain, Ltd.

(57) ABSTRACT

An inspecting apparatus for inspecting a test piece. The inspecting apparatus includes a test piece holding mechanism for holding the test piece, the test piece holding mechanism having a mounting portion formed from a transparent member having upper and lower exposed surfaces, the upper exposed surface of the transparent member functioning as a mounting surface for mounting the test piece, whereby the test piece mounted on the mounting surface of the mounting portion is adapted to be held by the test piece holding mechanism. The inspecting apparatus further includes an imaging mechanism for imaging the test piece held by the test piece holding mechanism, the imaging mechanism having a first imaging unit provided above the mounting portion, a second imaging unit provided below the mounting portion, and a connecting portion for connecting the first imaging unit and the second imaging unit.

19 Claims, 7 Drawing Sheets

INSPECTING APPARATUS AND PROCESSING APPARATUS INCLUDING THE SAME

BACKGROUND OF THE INVENTION

Field of the Invention

The present invention relates to an inspecting apparatus for imaging and inspecting a workpiece processed and also to a processing apparatus including the inspecting apparatus.

Description of the Related Art

A plurality of devices are formed on a front side of a thin plate-shaped workpiece such as a wafer. The workpiece having the plural devices is divided into individual device chips respectively including the plural devices. These device chips are mounted in various kinds of electronic equipment. The workpiece is divided by using a processing apparatus such as a cutting apparatus and a laser processing apparatus. The cutting apparatus includes an annular cutting blade for cutting the workpiece. The laser processing apparatus uses a laser beam to be applied to the workpiece, thereby processing the workpiece (see Japanese Patent Laid-Open No. 2018-166178, for example). To confirm that the workpiece has been properly processed, an inspecting apparatus is used to image and inspect a processed area of the workpiece processed by the processing apparatus. The inspecting apparatus functions to image and inspect the workpiece as a test piece. In processing the workpiece, a processed mark is formed in the workpiece by the processing apparatus, and chipping is formed along the processed mark. In the inspecting apparatus, a shape, a size, and distribution of such chipping are examined. Further, the size of each device chip formed by dividing the workpiece is also checked.

SUMMARY OF THE INVENTION

In inspecting the workpiece as a test piece by using the inspecting apparatus, it is desired to image and inspect both sides of the test piece at a specific position. Conventionally, in the case of inspecting both sides of the test piece at a specific position, the front side of the test piece is first imaged at the specific position by using an imaging unit. Thereafter, the test piece is inverted to image the back side of the test piece by using the imaging unit. Accordingly, time and effort are required to invert the test piece in inspecting both sides of the test piece. Further, in observing the specific position on the back side of the test piece, the position of the imaging unit must be adjusted to the specific position with high precision after inverting the test piece. There is a case that a notch is formed on an outer circumference of a wafer on which devices are to be formed. In this case, the position of the imaging unit may be adjusted with reference to this notch. However, the position accuracy of the notch formed is lower than the position accuracy of patterns formed on the test piece, so that the position of the imaging unit cannot be adjusted with reference to the notch with high precision.

It is therefore an object of the present invention to provide an inspecting apparatus which can easily observe a front side and a back side of a test piece at the same position.

It is another object of the present invention to provide a processing apparatus including the inspecting apparatus.

In accordance with an aspect of the present invention, there is provided an inspecting apparatus for inspecting a test piece attached to a transparent adhesive tape and supported through the adhesive tape to a ring frame, the inspecting apparatus including: a test piece holding mechanism for holding the test piece, the test piece holding mechanism having a mounting portion formed from a transparent member having upper and lower exposed surfaces, the upper exposed surface of the transparent member functioning as a mounting surface for mounting the test piece through the adhesive tape, whereby the test piece mounted on the mounting surface of the mounting portion through the adhesive tape is adapted to be held by the test piece holding mechanism; an imaging mechanism for imaging the test piece held by the test piece holding mechanism, the imaging mechanism having a first imaging unit provided above the mounting portion, a second imaging unit provided below the mounting portion, and a connecting portion for connecting the first imaging unit and the second imaging unit; and a moving unit for relatively moving the imaging mechanism with respect to the mounting portion in a direction parallel to the mounting surface. The first imaging unit of the imaging mechanism is adapted to image the upper surface of the test piece mounted on the mounting surface of the mounting portion and held by the test piece holding mechanism, the second imaging unit of the imaging mechanism is adapted to image the lower surface of the test piece mounted on the mounting surface of the mounting portion and held by the test piece holding mechanism, and the first imaging unit and the second imaging unit are adapted to image the upper surface and the lower surface of the test piece at the same position in the direction parallel to the mounting surface.

Preferably, the test piece holding mechanism further has a tape holding portion having a tape holding surface for holding the adhesive tape under suction, the tape holding surface being formed around an outer circumference of the mounting portion, the adhesive tape being held under suction in an annular area defined between an outer circumference of the test piece mounted on the mounting surface and an inner circumference of the ring frame; and a frame supporting portion provided around the tape holding portion for supporting the ring frame.

More preferably, a height of the mounting surface of the mounting portion is lower than a height of the tape holding surface of the tape holding portion.

Preferably, the mounting surface of the mounting portion is coated with fluororesin.

In accordance with another aspect of the present invention, there is provided a processing apparatus for processing a workpiece attached to a transparent adhesive tape and supported through the adhesive tape to a ring frame, the processing apparatus including: a workpiece holding unit for holding the workpiece; a processing unit for processing the workpiece held by the workpiece holding unit; an inspecting apparatus for inspecting the workpiece processed by the processing unit; and a transfer unit for transferring the workpiece from the workpiece holding unit to the inspecting apparatus. The inspecting apparatus includes a workpiece holding mechanism for holding the workpiece, the workpiece holding mechanism having a mounting portion formed from a transparent member having upper and lower exposed surfaces, the upper exposed surface of the transparent member functioning as a mounting surface for mounting the workpiece through the adhesive tape, whereby the workpiece mounted on the mounting surface of the mounting portion through the adhesive tape is adapted to be held by the workpiece holding mechanism; an imaging mechanism for imaging the workpiece held by the workpiece holding mechanism, the imaging mechanism having a first imaging unit provided above the mounting portion, a second imaging unit provided below the mounting portion, and a connecting portion for connecting the first imaging unit and the second imaging unit; and a moving unit for relatively moving the imaging mechanism with respect to the mounting portion in a direction parallel to the mounting surface. The first imaging unit of the imaging mechanism is adapted to image the upper surface of the workpiece mounted on the mounting surface of the mounting portion and held by the workpiece holding mechanism, the second imaging unit of the imaging mechanism is adapted to image the lower surface of the workpiece mounted on the mounting surface of the mounting portion and held by the workpiece holding mechanism, and the first imaging unit and the second imaging unit are adapted to image the upper surface and the lower surface of the workpiece at the same position in the direction parallel to the mounting surface.

Preferably, the workpiece holding mechanism further has a tape holding portion having a tape holding surface for holding the adhesive tape under suction, the tape holding surface being formed around an outer circumference of the mounting portion, the adhesive tape being held under suction in an annular area defined between an outer circumference of the workpiece mounted on the mounting surface and an inner circumference of the ring frame; and a frame supporting portion provided around the tape holding portion for supporting the ring frame.

More preferably, a height of the mounting surface of the mounting portion is lower than a height of the tape holding surface of the tape holding portion.

Preferably, the mounting surface of the mounting portion is coated with fluororesin.

The test piece holding mechanism (workpiece holding mechanism) included in the inspecting apparatus (processing apparatus) according to the present invention has the mounting portion formed from a transparent member. Accordingly, when the test piece (workpiece) is mounted on the mounting surface of the mounting portion, the upper surface of the test piece can be visually recognized from the upper side of the mounting portion, and the lower surface of the test piece can also be visually recognized from the lower side of the mounting portion through the mounting portion. Accordingly, in imaging the upper surface and the lower surface of the test piece, it is unnecessary to invert the test piece. Further, the inspecting apparatus includes the imaging mechanism having the first imaging unit provided above the mounting portion and the second imaging unit provided below the mounting portion. When the test piece is mounted on the mounting surface of the mounting portion and held by the test piece holding mechanism, the upper surface of the test piece can be imaged by the first imaging unit, and the lower surface of the test piece can be imaged through the transparent member by the second imaging unit. In particular, the imaging mechanism further has the connecting portion for connecting the first imaging unit and the second imaging unit. Accordingly, even when the imaging mechanism is moved by the moving unit, the relative position of one of the first and second imaging units with respect to the other is not changed. That is, it is unnecessary to make the position of the first imaging unit coincide with the position of the second imaging unit in the direction parallel to the mounting surface. Accordingly, the upper surface and the lower surface of the test piece can be easily imaged at the same position in the direction parallel to the mounting surface.

Thus, according to the present invention, it is possible to provide an inspecting apparatus which can easily observe the front side and the back side of a test piece at the same position. It is also possible to provide a processing apparatus including the inspecting apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
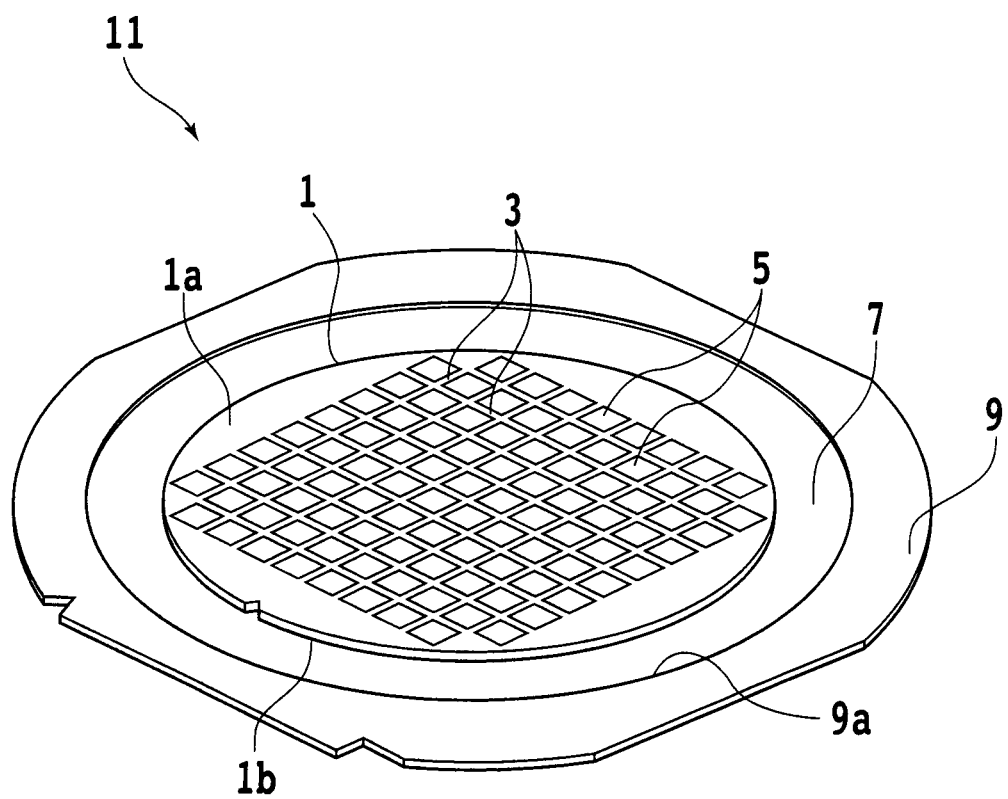
FIG. 1 is a schematic perspective view of a test piece.

A preferred embodiment of an inspecting apparatus according to the present invention will now be described with reference to the attached drawings. The inspecting apparatus according to the preferred embodiment is adapted to use a workpiece processed by a processing apparatus as a test piece and image an upper surface and a lower surface of the test piece simultaneously, thereby inspecting the test piece. The test piece will first be described. The test piece is a substantially disk-shaped wafer formed of a semiconductor such as Si (silicon), SiC (silicon carbide), GaN (gallium nitride), and GaAs (gallium arsenide). The wafer may be formed of any other semiconductors. The test piece may be a substrate formed of sapphire, glass, or silica, for example. Further, the test piece may also be a package substrate including a plurality of device chips sealed with a mold resin. FIG. 1 is a schematic perspective view depicting a wafer as a test piece 1 to be inspected according to the preferred embodiment. As depicted in FIG. 1, the test piece 1 has a front side (upper surface) 1a and a back side (lower surface) 1b. The front side 1a of the test piece 1 is partitioned by a plurality of crossing division lines called streets 3 to thereby define a plurality of separate regions where a plurality of devices 5 such as integrated circuits (ICs) and large-scale integrated circuits (LSIs) are respectively formed. By dividing the test piece 1 along the streets 3, a plurality of individual device chips can be formed.

In dividing the test piece 1, a laser processing apparatus may be used. In this case, a laser beam is applied to the test piece 1 along the streets 3, thereby laser-processing the test piece 1. Alternatively, a cutting apparatus may be used. In this case, the test piece 1 is cut along the streets 3 by using an annular cutting blade. Prior to loading the test piece 1 into a processing apparatus such as a laser processing apparatus and a cutting apparatus, the test piece 1 is united with a ring frame 9 and a transparent adhesive tape 7 to form a frame unit 11 as depicted in FIG. 1. More specifically, the back side 1*b* of the test piece 1 is attached to a central portion of the adhesive tape 7 having a circular shape, and a peripheral portion of the adhesive tape 7 is attached to one side of the ring frame 9 having a circular inside opening 9*a* so as to close the circular inside opening 9*a* of the ring frame 9. Accordingly, the test piece 1 is attached to the adhesive tape 7 so as to be disposed in the inside opening 9*a* of the ring frame 9 attached to the adhesive tape 7. Thus, the test piece 1 is supported through the adhesive tape 7 to the ring frame 9, thereby forming the frame unit 11, so that the frame unit 11 is loaded into the processing apparatus. The individual device chips obtained by dividing the test piece 1 are supported (attached) to the adhesive tape 7.

To confirm that the test piece 1 has been properly processed along the streets 3, a processed area of the test piece 1 is imaged by using the inspecting apparatus according to the preferred embodiment, thereby inspecting the test piece 1. In the inspecting apparatus, the test piece 1 is inspected along each street 3 to examine the position of a processed mark formed along each street 3 and a shape, a size, and distribution of chipping formed along the processed mark. Further, the size of each device chip formed by dividing the test piece 1 is also checked. However, the use of the inspecting apparatus according to the preferred embodiment is not limited. The preferred embodiment will be described in the case that the test piece 1 is a wafer having the plural devices 5 on the front side 1*a*, in which the wafer has been divided along the streets 3. However, the test piece 1 is not limited to such a wafer. Further, the test piece 1 to be inspected by the inspecting apparatus according to the preferred embodiment may not be a workpiece processed by a processing apparatus.

Figure 2:
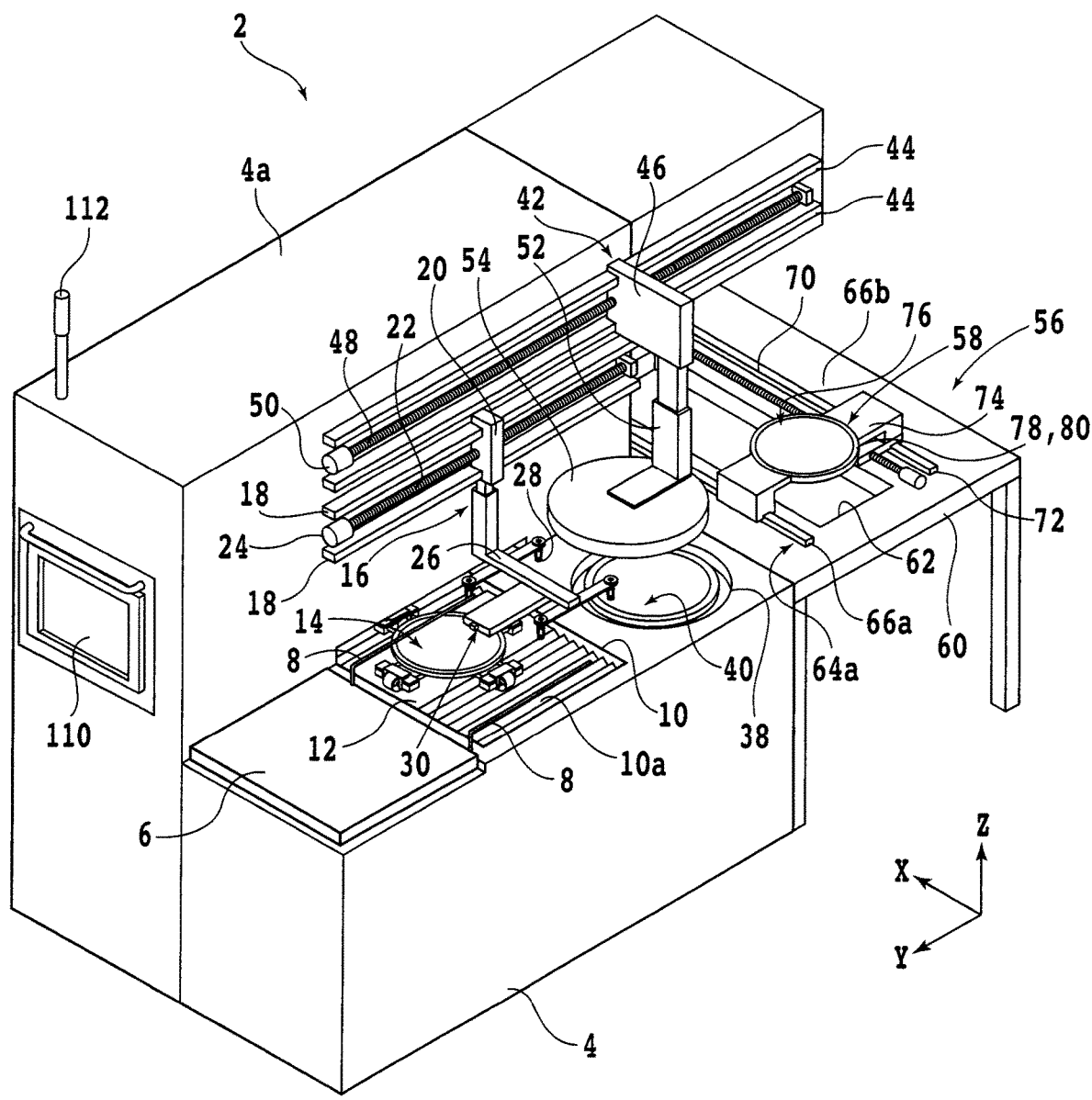
FIG. 2 is a schematic perspective view of a processing apparatus including an inspecting apparatus according to a preferred embodiment of the present invention.

The inspecting apparatus according to the preferred embodiment is incorporated in a processing apparatus including a processing unit for processing the test piece 1 as a workpiece. However, the inspecting apparatus may not be incorporated in such a processing apparatus, but may be an independent apparatus. FIG. 2 is a schematic perspective view of a processing apparatus 2 incorporating the inspecting apparatus according to the preferred embodiment. As depicted in FIG. 2, the processing apparatus 2 includes a base housing 4 for supporting each component. The base housing 4 has a substantially rectangular shape as viewed in plan. A cassette support table 6 is provided at a front corner portion of the base housing 4. The cassette support table 6 is vertically movable. The cassette support table 6 has an upper surface for mounting a cassette (not depicted) storing a plurality of frame units 11.

A rectangular opening 10 is formed on an upper surface of the base housing 4 at a position adjacent to the cassette support table 6. The rectangular opening 10 is elongated in an X direction (feeding direction) depicted by an arrow X in FIG. 2. There are provided in the rectangular opening 10 a movable table 12, a workpiece holding unit 14 mounted on the movable table 12, an X moving mechanism (not depicted) for moving the movable table 12 in the X direction, and a dust-proof and drip-proof cover 10*a* for covering the X moving mechanism.

The processing apparatus 2 includes a transfer unit 16 for transferring the frame unit 11 from the cassette mounted on the cassette support table 6 before processing and returning the frame unit 11 to the cassette after processing. The transfer unit 16 has a pair of guide rails 18 extending in a Y direction depicted by an arrow Y in FIG. 2. The guide rails 18 are provided on a front surface of a rising portion 4*a* rising upright from the upper surface of the base housing 4 at a rear portion thereof. A movable member 20 is slidably mounted on the guide rails 18. A nut portion (not depicted) is formed on a rear surface of the movable member 20, and a ball screw 22 extending parallel to the guide rails 18 is threadedly engaged with this nut portion. A pulse motor 24 for rotating the ball screw 22 is connected to one end of the ball screw 22. Accordingly, when the ball screw 22 is rotated by the pulse motor 24, the movable member 20 is moved in the Y direction along the guide rails 18. An arm member 26 extending in the X direction is connected through an elevating mechanism (not depicted) to a lower end of the movable member 20. Accordingly, the arm member 26 is vertically movable by this elevating mechanism. A plurality of suction members 28 for holding the frame unit 11 under suction are provided on a lower surface of the arm member 26 so as to be arranged suitably according to the size of the ring frame 9. A push-pull mechanism 30 for drawing the frame unit 11 from the cassette is provided at a center of the arm member 26 so as to project toward the cassette support table 6.

A pair of transfer rails 8 is provided on the upper surface of the base housing 4 so as to straddle the rectangular opening 10. The transfer rails 8 extend in parallel to each other in the Y direction. The transfer rails 8 are spaced a given distance from each other in the X direction, this given distance being smaller than an outer diameter of the ring frame 9. However, this given distance is changeable. That is, the transfer rails 8 are movable toward and away from each other in the X direction.

The transfer unit 16 is operated in the following manner. When the movable member 20 is moved in the Y direction by operating the pulse motor 24, the push-pull mechanism 30 is moved through the arm member 26 in the Y direction so that a front end of the push-pull mechanism 30 is inserted into the cassette mounted on the cassette support table 6 so as to hold the ring frame 9 of the frame unit 11 stored in the cassette. Thereafter, the arm member 26 is moved backward in the Y direction to retract the push-pull mechanism 30 holding the ring frame 9 away from the cassette. Accordingly, the frame unit 11 is moved to the position on the transfer rails 8 by the push-pull mechanism 30. Thereafter, the ring frame 9 is released from the push-pull mechanism 30, and the suction members 28 mounted on the lower surface of the arm member 26 are lowered to come into contact with the ring frame 9. Thereafter, the suction members 28 are operated to hold the ring frame 9 under suction. Thereafter, the arm member 26 is raised to lift the frame unit 11 from the transfer rails 8. Thereafter, the spacing between the transfer rails 8 is increased and the arm member 26 is next lowered to lower the frame unit 11 until the frame unit 11 is placed on the workpiece holding unit 14.

For example, the workpiece holding unit 14 is a chuck table for holding the test piece 1 (wafer). The workpiece holding unit 14 has an upper surface provided with a porous member. The porous member has an upper surface as a holding surface for holding the frame unit 11. The porous member is connected through a suction passage (not depicted) to a vacuum source (not depicted) for producing a suction force, in which this suction passage is formed inside the workpiece holding unit 14. Accordingly, the frame unit 11 can be held on the workpiece holding unit 14 under suction.

Figure 3:
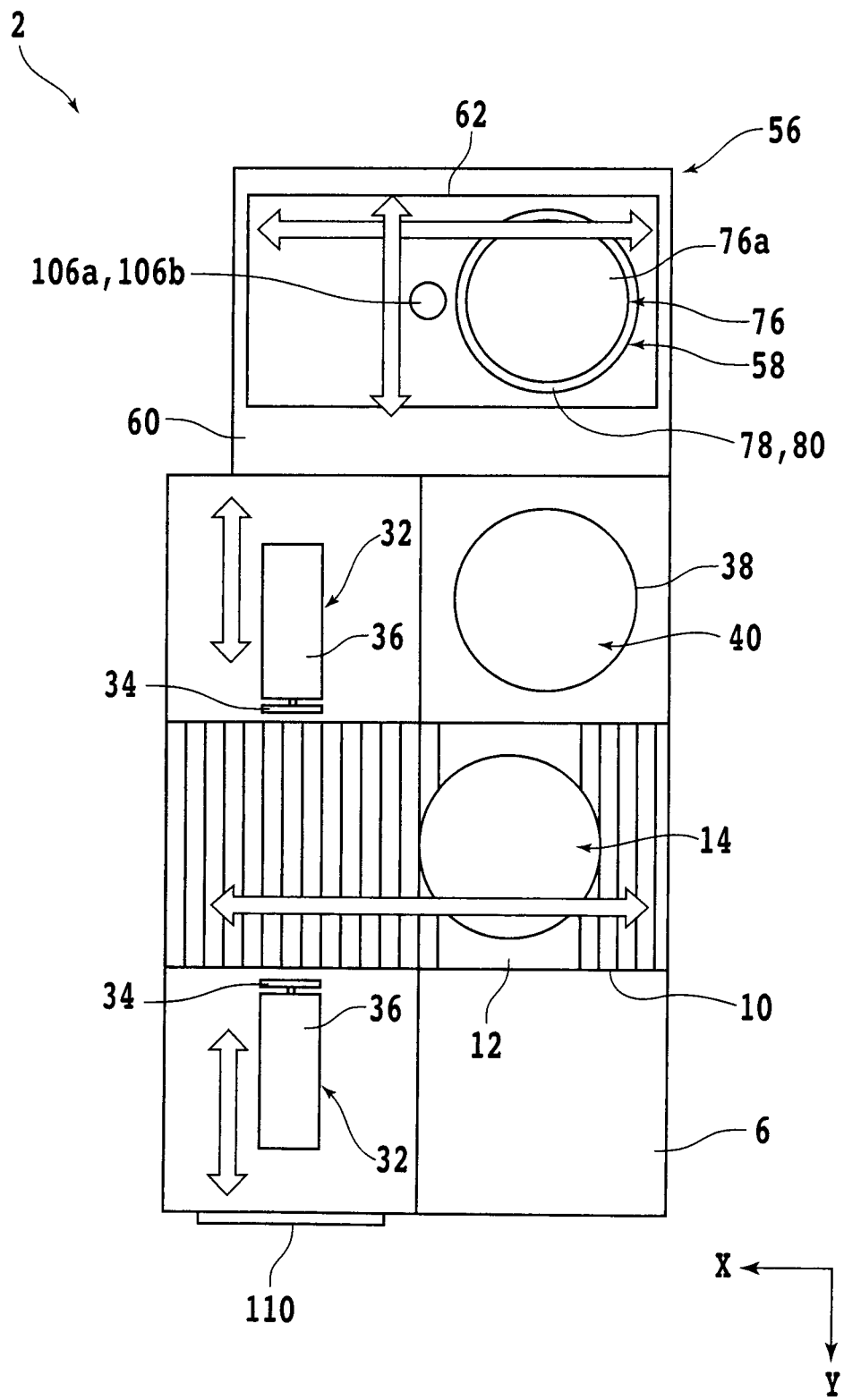
FIG. 3 is a schematic top plan view of the processing apparatus depicted in FIG. 2.

FIG. 3 is a schematic top plan view depicting a configuration of the processing apparatus 2. As depicted in FIG. 3, the processing apparatus 2 includes a pair of processing units 32 for processing the test piece 1 as a workpiece. Each processing unit 32 is a cutting unit in the preferred embodiment. The cutting unit includes an annular cutting blade 34 having a central through hole, a spindle (not depicted) as a rotating shaft inserted through the central through hole of the cutting blade 34 for mounting the cutting blade 34, a spindle housing 36 for rotatably supporting the spindle, and a motor (not depicted) for rotating the spindle. The workpiece held on the workpiece holding unit 14 is adapted to be cut by each cutting blade 34 being rotated as being fed in the X direction. While the processing apparatus 2 depicted in FIG. 3 includes the two processing units 32 for cutting the test piece 1 in the preferred embodiment, the configuration of the processing apparatus 2 is not limited to this configuration. For example, the processing apparatus 2 may include a single processing unit. Further, the processing apparatus 2 may include a laser processing unit for laser-processing the test piece 1 instead of a cutting unit.

As depicted in FIGS. 2 and 3, the processing apparatus 2 has a circular opening 38 at a position adjacent to the rectangular opening 10 formed on the upper surface of the base housing 4. There is provided inside the circular opening 38 a cleaning apparatus 40 for cleaning the test piece 1 processed by the processing units 32. The cleaning apparatus 40 includes a cleaning table for mounting the test piece 1 processed and a nozzle for spraying a cleaning water at high pressure to the test piece 1 mounted on the cleaning table. The cleaning table is adapted to be rotated at a high speed. Accordingly, the test piece 1 processed is transferred from the workpiece holding unit 14 to the cleaning table of the cleaning apparatus 40 by operating the transfer unit 16. Thereafter, the cleaning table is rotated at a high speed and a high-pressure cleaning water is sprayed from the nozzle to the test piece 1 mounted on the cleaning table, thereby cleaning the test piece 1 processed.

The test piece 1 may be transferred to the cleaning apparatus 40 by operating a transfer unit 42 instead of the transfer unit 16. The transfer unit 42 has a pair of guide rails 44 extending in the Y direction. The guide rails 44 are provided on the front surface of the rising portion 4a of the base housing 4. A movable member 46 is slidably mounted on the guide rails 44. A nut portion (not depicted) is formed on a rear surface of the movable member 46, and a ball screw 48 extending parallel to the guide rails 44 is threadedly engaged with this nut portion. A pulse motor 50 for rotating the ball screw 48 is connected to one end of the ball screw 48. Accordingly, when the ball screw 48 is rotated by the pulse motor 50, the movable member 46 is moved in the Y direction along the guide rails 44. An arm member 52 is connected through an elevating mechanism (not depicted) to a lower end of the movable member 46. Accordingly, the arm member 52 is vertically movable by this elevating mechanism. A holding mechanism 54 is connected to the lower end of the arm member 52, so as to hold the frame unit 11 from the upper side thereof. The holding mechanism 54 is provided with a plurality of suction members (not depicted) for holding the frame unit 11 under suction. These suction members are suitably arranged according to the size of the ring frame 9.

As described above, the plural devices 5 are previously formed on the front side 1a of the test piece 1, and the test piece 1 is divided into the individual device chips respectively including the plural devices 5 by operating the processing units 32 of the processing apparatus 2. To confirm that the test piece 1 has been properly processed by the processing units 32, the test piece 1 processed is inspected by an inspecting apparatus 56 depicted in FIGS. 2 and 3.

That is, after cleaning the test piece 1 by operating the cleaning apparatus 40, the test piece 1 (the frame unit 11) is held by the holding mechanism 54 and then transferred to the inspecting apparatus 56 by operating the transfer unit 42. As a modification, the test piece 1 may be transferred to the inspecting apparatus 56 by operating the transfer unit 16 instead of the transfer unit 42. Preferably, an orientation of the cleaning table may be adjusted before operating the transfer unit 16 or 42 to hold the test piece 1, thereby adjusting an orientation of the test piece 1 to a predetermined orientation before transferring the test piece 1 to the inspecting apparatus 56.

For example, in the inspecting apparatus 56, the test piece 1 is inspected along each dividing groove formed on the test piece 1 to examine a shape, a size, and distribution of chipping formed along each dividing groove on the test piece 1. Further, the size of each device chip formed by dividing the test piece 1 is also checked. The inspecting apparatus 56 is capable of observing the same position on the upper surface (front side 1a) and on the lower surface (back side 1b) of the test piece 1 simultaneously. As depicted in FIG. 2, the inspecting apparatus 56 is incorporated in the processing apparatus 2, so that the test piece 1 processed can be immediately inspected. There will now be described the inspecting apparatus 56 incorporated in the processing apparatus 2 according to the preferred embodiment. However, the inspecting apparatus 56 according to the present invention is not limited to this configuration.

Figure 4:
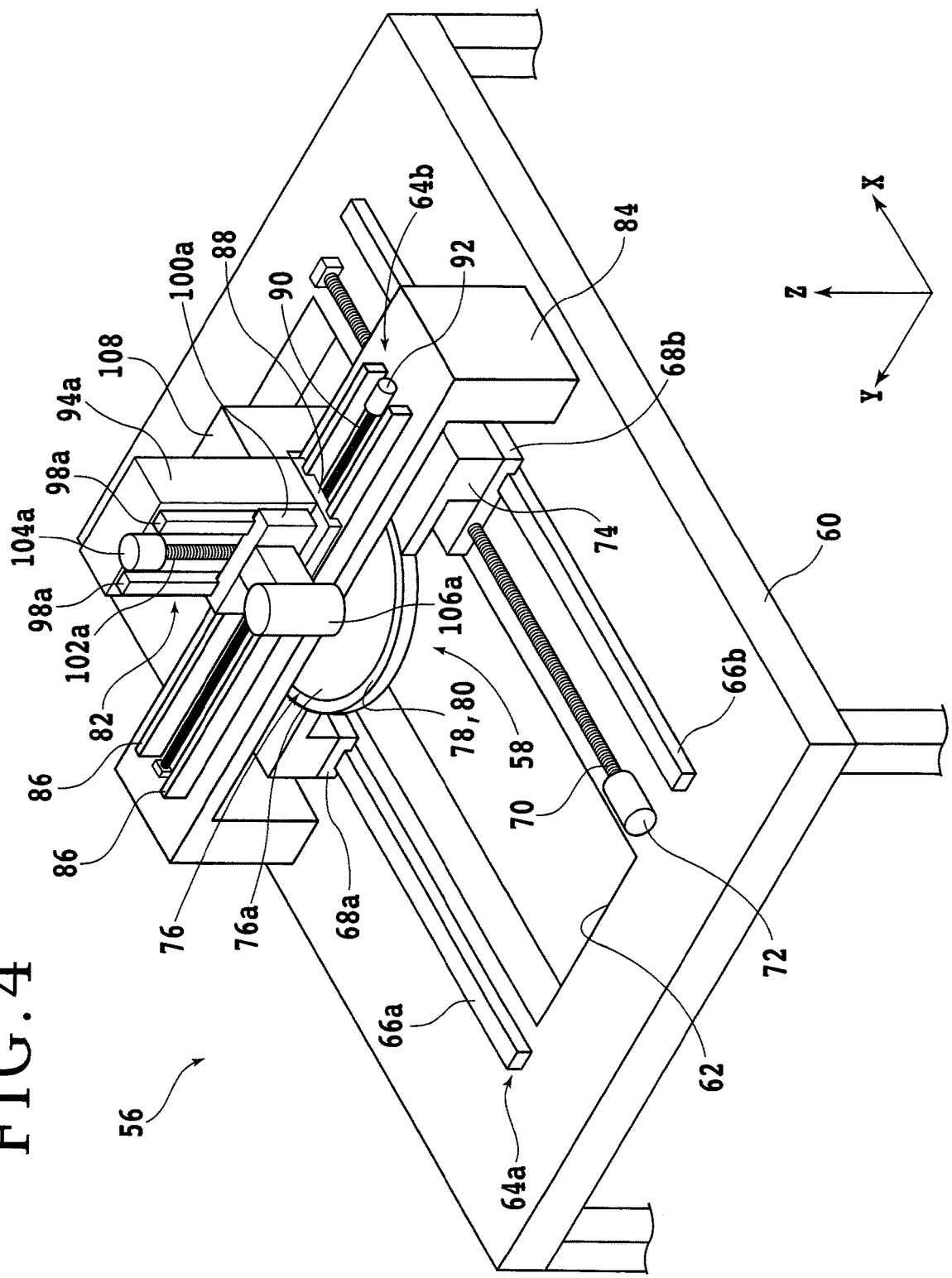
FIG. 4 is a schematic perspective view of the inspecting apparatus depicted in FIG. 2.
Figure 5A:
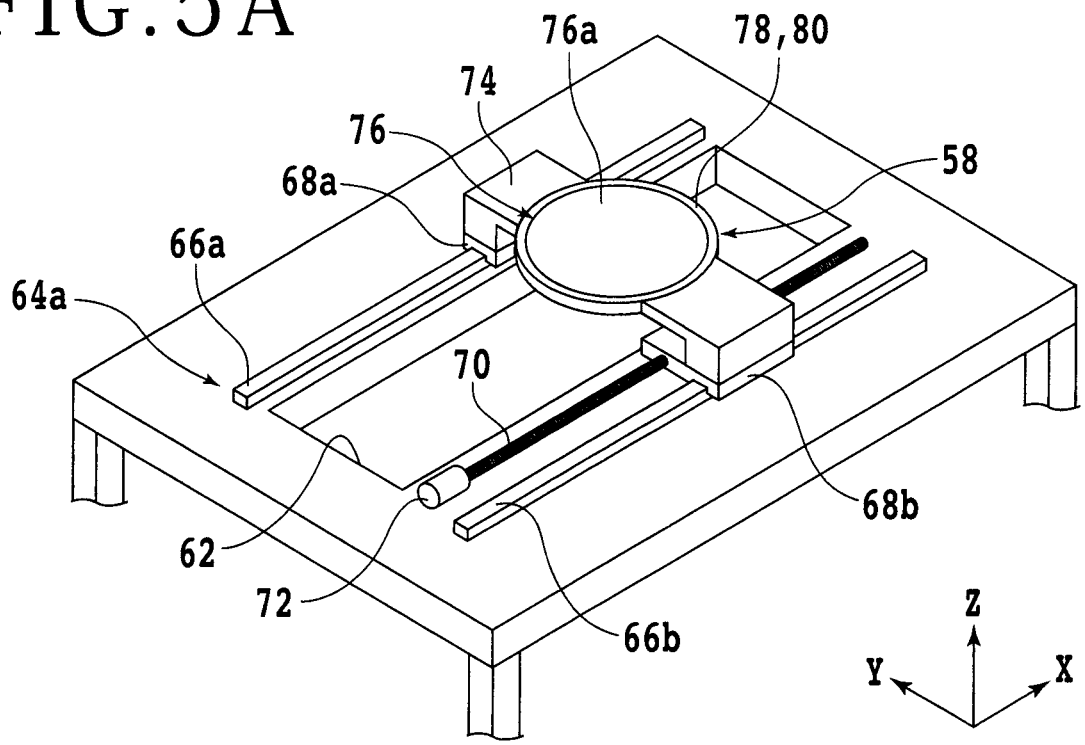
FIG. 5A is a schematic perspective view of a test piece holding mechanism included in the inspecting apparatus.
Figure 5B:
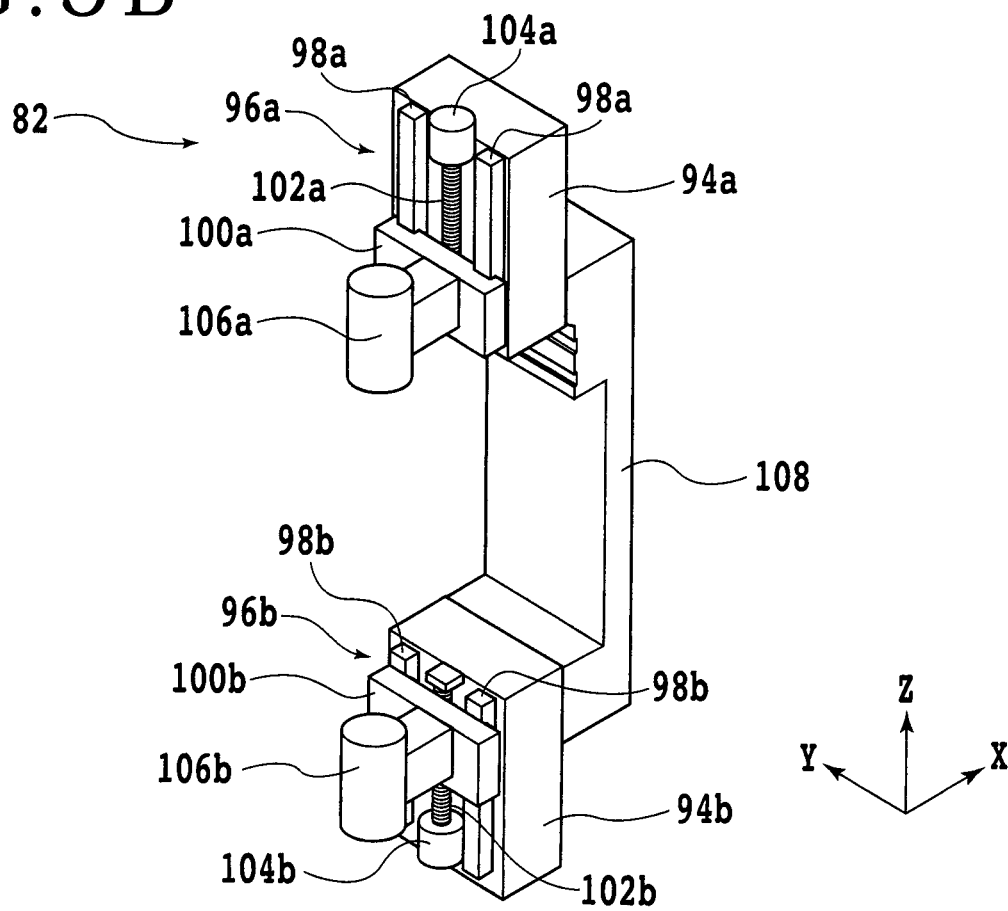
FIG. 5B is a schematic perspective view of an imaging mechanism included in the inspecting apparatus.

FIG. 4 is a schematic perspective view of the inspecting apparatus 56. As depicted in FIG. 4, the inspecting apparatus 56 includes a base 60 for supporting each component of the inspecting apparatus 56. The base 60 has a rectangular opening 62 elongated in the X direction. The inspecting apparatus 56 includes a test piece holding mechanism 58 for holding the test piece 1 and an imaging mechanism 82 for imaging the test piece 1 held by the test piece holding mechanism 58. The test piece holding mechanism 58 is provided so as to straddle the rectangular opening 62 of the base 60. The inspecting apparatus 56 further includes an X moving unit 64a for relatively moving the test piece holding mechanism 58 and the imaging mechanism 82 in the X direction and a Y moving unit 64b for relatively moving the test piece holding mechanism 58 and the imaging mechanism 82 in the Y direction. FIG. 5A is a schematic perspective view of the X moving unit 64a and the test piece holding mechanism 58 of the inspecting apparatus 56. FIG. 5B is a schematic perspective view of the imaging mechanism 82 of the inspecting apparatus 56. The X moving unit 64a includes a guide rail 66a extending in the X direction along one side edge of the rectangular opening 62 formed on the upper surface of the base 60. The X moving unit 64a includes another guide rail 66b extending parallel to the guide rail 66a along another side edge of the rectangular opening 62 opposite to the above one side edge. A movable member 68a is slidably mounted on the guide rail 66a, and another movable member 68b is slidably mounted on the guide rail 66b.

A bridge-shaped support structure 74 is provided on the movable members 68a and 68b so as to overhang the movable members 68a and 68b. A nut portion (not depicted) is formed on a lower surface of the movable member 68b, and a ball screw 70 extending parallel to the guide rails 66a and 66b is threadedly engaged with this nut portion. A pulse motor 72 for rotating the ball screw 70 is connected to one end of the ball screw 70. Accordingly, when the ball screw 70 is rotated by the pulse motor 72, the movable member 68b is moved in the X direction along the guide rail 66b. The movable member 68b is connected through the support structure 74 to the other movable member 68a. Accordingly, the movable member 68a is also moved in the X direction along the guide rail 66a together with the movable member 68b and the support structure 74. In other words, the support structure 74 is moved in the X direction by moving the movable members 68a and 68b in the X direction. The test piece holding mechanism 58 is supported to the support structure 74 at a position just above the rectangular opening 62 of the base 60. Accordingly, the test piece holding mechanism 58 can be moved in the X direction by moving the support structure 74 in the X direction.

Figure 6A:
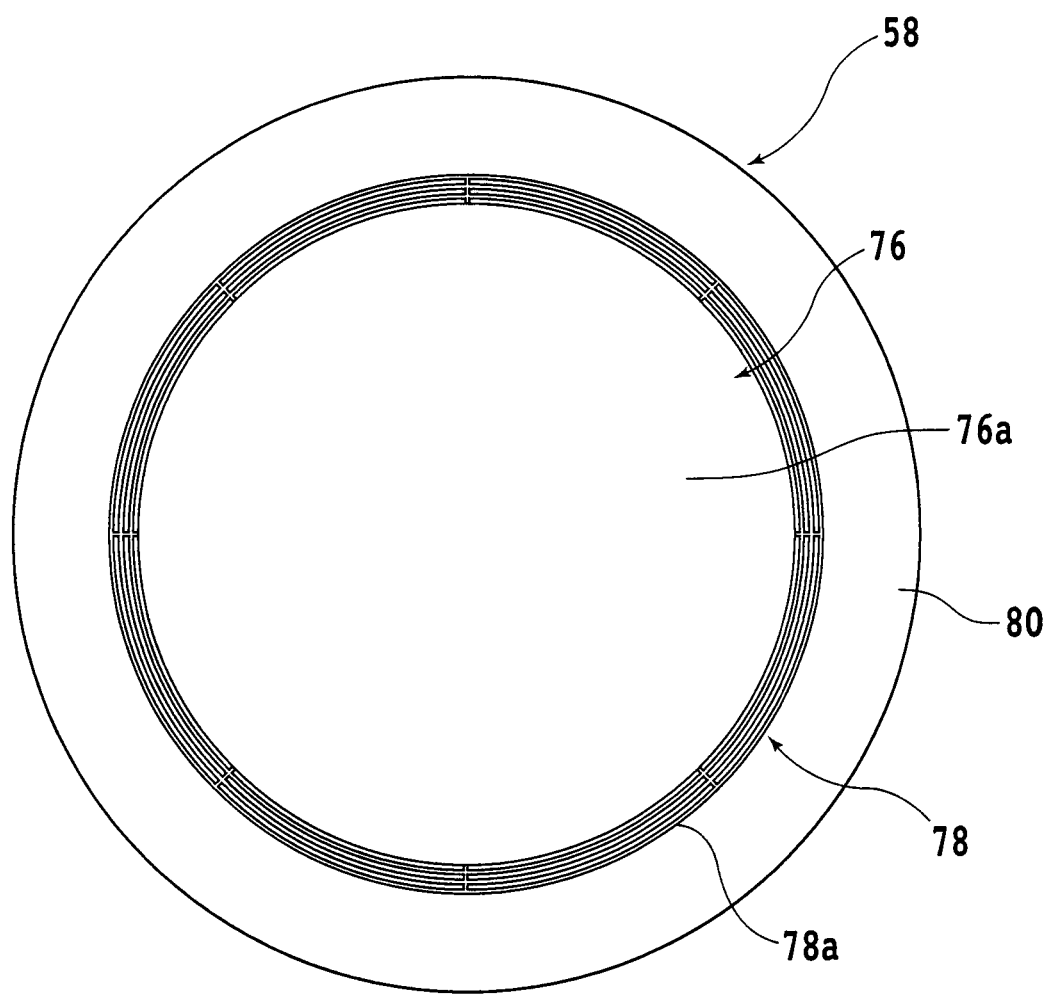
FIG. 6A is a schematic top plan view of a mounting portion included in the test piece holding mechanism.
Figure 6B:
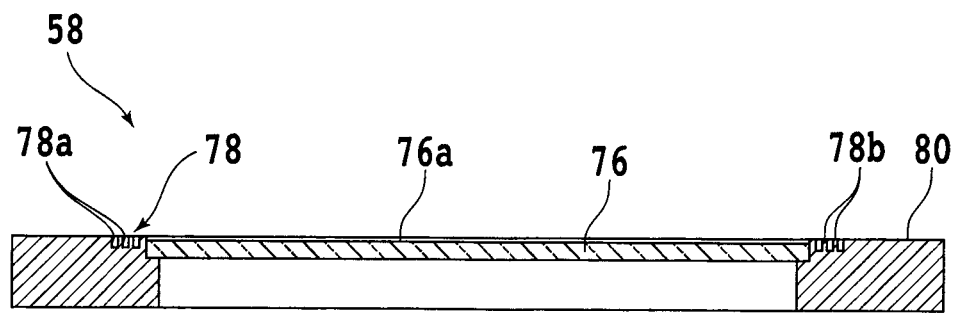
FIG. 6B is a schematic sectional view of the mounting portion depicted in FIG. 6A.

The test piece holding mechanism 58 includes a mounting portion 76 formed from a transparent member having upper and lower exposed surfaces. The transparent member is formed of glass or resin (plastic), for example. The upper surface of the transparent member functions as a mounting surface 76a for mounting the test piece 1 through the transparent adhesive tape 7 attached thereto. Accordingly, the test piece 1 can be supported by the test piece holding mechanism 58 so as to be mounted on the mounting surface 76a. FIG. 6A is a schematic top plan view of the test piece holding mechanism 58, and FIG. 6B is a schematic sectional view of the test piece holding mechanism 58. As mentioned above, the lower surface of the transparent member opposite to the mounting surface 76a is also exposed, so that the lower surface of the test piece 1 mounted on the mounting surface 76a through the transparent adhesive tape 7 can also be observed from the lower surface of the transparent member.

The test piece holding mechanism 58 includes a tape holding portion 78 having a tape holding surface 78b for holding the adhesive tape 7 of the frame unit 11 under suction. The tape holding surface 78b is formed around an outer circumference of the mounting portion 76. The tape holding portion 78 has a suction groove 78a formed on the tape holding surface 78b. The suction groove 78a is connected through a suction passage (not depicted) to a vacuum source (not depicted) for producing a suction force. The test piece holding mechanism 58 further includes an annular frame supporting portion 80 for supporting the ring frame 9 of the frame unit 11. The frame supporting portion 80 is arranged around the tape holding portion 78. Accordingly, when the frame unit 11 is mounted on the test piece holding mechanism 58 in such a manner that the ring frame 9 is superimposed on the frame supporting portion 80, and the vacuum source is next operated, the test piece 1 of the frame unit 11 is held under suction through the adhesive tape 7 on the mounting surface 76a of the mounting portion 76 of the test piece holding mechanism 58. At this time, the adhesive tape 7 is sucked to come into close contact with the whole of the mounting surface 76a, so that there is no possibility that the test piece 1 held on the test piece holding mechanism 58 may be shifted in position during the inspection.

Further, also in the case that the test piece 1 is a wafer having a warp, the test piece 1 can be held on the test piece holding mechanism 58 in the condition where the adhesive tape 7 is sucked to come into close contact with the whole of the mounting surface 76a. That is, the test piece 1 can be held on the test piece holding mechanism 58 under suction in the condition where the warp in the wafer is reduced. Since the warp in the test piece 1 held on the test piece holding mechanism 58 is reduced, it is possible to suppress the possibility that a focal point of an imaging unit to be hereinafter described may be deviated from the test piece 1 in sequentially imaging a plurality of target areas on the test piece 1. Accordingly, the test piece 1 can be imaged more clearly.

A height of the mounting surface 76a of the mounting portion 76 may be lower than a height of the tape holding surface 78b of the tape holding portion 78 as depicted in FIG. 6B. Further, the suction groove 78a formed on the tape holding surface 78b may reach the mounting portion 76 as depicted in FIG. 6A. In this case, a spacing is defined between the adhesive tape 7 and the mounting surface 76a in the condition where the frame unit 11 is mounted on the test piece holding mechanism 58. Further, when the vacuum source connected to the suction groove 78a is operated, this spacing is evacuated through the suction groove 78a, so that the central area of the adhesive tape 7 attached to the test piece 1 can be quickly sucked to come into close contact with the mounting surface 76a.

More specifically, the height of the mounting surface 76a of the mounting portion 76 is preferably set lower by approximately 1 mm than the height of the tape holding surface 78b of the tape holding portion 78. A test was conducted to confirm the effect of this configuration in the case that the frame unit 11 including a wafer having a diameter of 300 mm as the test piece 1 was prepared and the frame unit 11 was held on the test piece holding mechanism 58. In this test, the height of the mounting surface 76a of the mounting portion 76 was set lower by 1 mm than the height of the tape holding surface 78b of the tape holding portion 78, and the frame unit 11 prepared above was held on the test piece holding mechanism 58 under suction. In this condition, the time required to bring the adhesive tape 7 into close contact with the whole of the mounting surface 76a was measured. In the above case, the time required to bring the adhesive tape 7 into close contact with the whole of the mounting surface 76a was several seconds. As a comparison, the time required to bring the adhesive tape 7 into close contact with the whole of the mounting surface 76a was measured in the case that the height of the mounting surface 76a was set equal to the height of the tape holding surface 78b. In this comparison, approximately ten minutes were required to bring the adhesive tape 7 into close contact with the whole of the mounting surface 76a. Thus, it was confirmed that the time required to hold the frame unit 11 on the test piece holding mechanism 58 under suction can be greatly reduced by setting the height of the mounting surface 76a lower than the height of the tape holding surface 78b.

Figure 7:
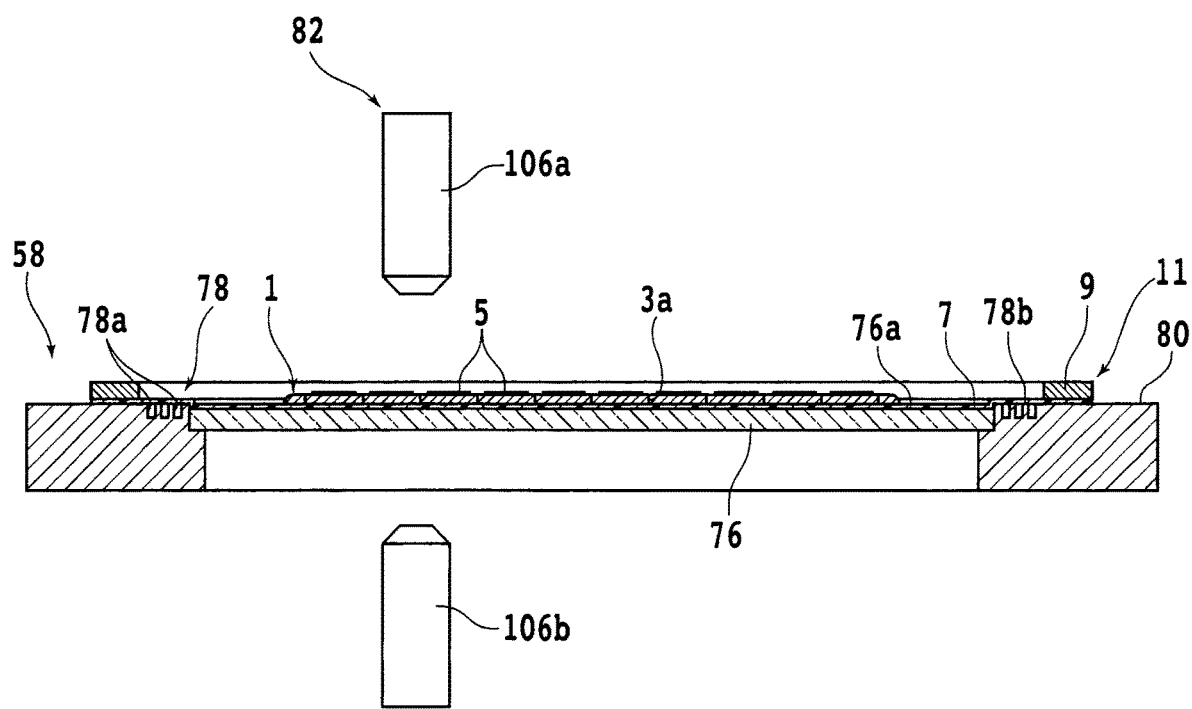
FIG. 7 is a schematic sectional view depicting a positional relation among the test piece holding mechanism, the imaging mechanism, and the test piece in inspecting the test piece.

FIG. 7 is a schematic sectional view of the frame unit 11 and the test piece holding mechanism 58 in the condition where the test piece 1 is held by the test piece holding mechanism 58 under suction. As depicted in FIG. 7, the spacing defined between the adhesive tape 7 and the mounting surface 76a due to the level difference therebetween is evacuated by operating the vacuum source, so that the adhesive tape 7 comes into close contact with the mounting surface 76a. After finishing the inspection of the test piece 1, the vacuum source is stopped in operation and the frame unit 11 is next unloaded from the test piece holding mechanism 58. At this time, to facilitate the peeling off the adhesive tape 7 from the mounting surface 76a, the mounting surface 76a may be previously coated with fluororesin.

The imaging mechanism 82 will now be described. As depicted in FIG. 4, the imaging mechanism 82 is supported by a double column type support structure 84 provided on the upper surface of the base 60 so as to straddle the opening 62, the X moving unit 64a, and the test piece holding mechanism 58. A Y moving unit 64b for moving the imaging mechanism 82 in the Y direction is provided on the support structure 84. The Y moving unit 64*b* includes a pair of guide rails 86 provided on the upper surface of the support structure 84 so as to extend in the Y direction. A movable member 88 for supporting the imaging mechanism 82 is slidably mounted on the guide rails 86. A nut portion (not depicted) is formed on a lower surface of the movable member 88, and a ball screw 90 extending parallel to the guide rails 86 is threadedly engaged with this nut portion. A pulse motor 92 for rotating the ball screw 90 is connected to one end of the ball screw 90. Accordingly, when the ball screw 90 is rotated by the pulse motor 92, the movable member 88 is moved in the Y direction along the guide rails 86, so that the imaging mechanism 82 is moved in the Y direction. The X moving unit 64*a* and the Y moving unit 64*b* cooperate to function as a moving unit for relatively moving the test piece holding mechanism 58 and the imaging mechanism 82 in a direction parallel to the mounting surface 76*a*.

The imaging mechanism 82 includes a first imaging unit 106*a* provided above the mounting portion 76 of the test piece holding mechanism 58 and a second imaging unit 106*b* provided below the mounting portion 76 (the second imaging unit 106*b* being not depicted in FIG. 4). As depicted in FIG. 5B, the imaging mechanism 82 further includes a connecting portion 108 for connecting the first imaging unit 106*a* and the second imaging unit 106*b*.

The first imaging unit 106*a* is supported to a columnar support structure 94*a*. An elevating mechanism 96*a* for vertically moving the first imaging unit 106*a* is provided on a front surface of the columnar support structure 94*a*. The elevating mechanism 96*a* includes a pair of guide rails 98*a* extending in a Z direction depicted by an arrow Z in FIG. 5B, a movable member 100*a* slidably mounted on the guide rails 98*a*, and a ball screw 102*a* extending parallel to the guide rails 98*a*. A nut portion (not depicted) is formed on a rear surface of the movable member 100*a*, and the ball screw 102*a* is threadedly engaged with this nut portion. The first imaging unit 106*a* is fixed to a front surface of the movable member 100*a*. A pulse motor 104*a* for rotating the ball screw 102*a* is connected to one end of the ball screw 102*a*. Accordingly, when the ball screw 102*a* is rotated by the pulse motor 104*a*, the movable member 100*a* is moved in the Z direction along the guide rails 98*a*, so that the first imaging unit 106*a* fixed to the movable member 100*a* is moved in the Z direction.

An upper end portion of the connecting portion 108 on a front surface thereof is connected to a lower end portion of the support structure 94*a* on a rear surface thereof. Similarly, the second imaging unit 106*b* is supported to a columnar support structure 94*b*, and a lower end portion of the connecting portion 108 on the front surface thereof is connected to an upper end portion of the support structure 94*b* on the rear surface thereof. An elevating mechanism 96*b* for vertically moving the second imaging unit 106*b* is provided on the front surface of the support structure 94*b*. The elevating mechanism 96*b* is similar in configuration to the elevating mechanism 96*a* provided on the support structure 94*a*. That is, the elevating mechanism 96*b* includes a pair of guide rails 98*b* extending in the Z direction, a movable member 100*b* slidably mounted on the guide rails 98*b*, and a ball screw 102*b* extending parallel to the guide rails 98*b*. A nut portion (not depicted) is formed on the rear surface of the movable member 100*b*, and the ball screw 102*b* is threadedly engaged with this nut portion. The second imaging unit 106*b* is fixed to the front surface of the movable member 100*b*. A pulse motor 104*b* for rotating the ball screw 102*b* is connected to one end of the ball screw 102*b*. Accordingly, when the ball screw 102*b* is rotated by the pulse motor 104*b*, the movable member 100*b* is moved in the Z direction along the guide rails 98*b*, so that the second imaging unit 106*b* fixed to the movable member 100*b* is moved in the Z direction.

The first imaging unit 106*a* is oriented downward and can accordingly image the upper surface 1*a* of the test piece 1 mounted on the upper surface of the test piece holding mechanism 58. Further, the second imaging unit 106*b* is oriented upward and can accordingly image the lower surface 1*b* of the test piece 1 through the mounting portion 76 formed from a transparent member and the transparent adhesive tape 7 attached to the back side 1*b* of the test piece 1. Each of the first imaging unit 106*a* and the second imaging unit 106*b* is an area camera, line camera, three-dimensional camera, or infrared camera, for example. In the case of imaging the test piece 1 through the mounting portion 76 and the adhesive tape 7, there is a case that an image to be obtained may be influenced by a spherical aberration to cause a reduction in contrast of the image. To cope with this problem, the second imaging unit 106*b* may have a compensating unit such as a compensating ring capable of reducing the influence of the spherical aberration.

In the imaging mechanism 82, the first imaging unit 106*a* and the second imaging unit 106*b* are connected to each other by the connecting portion 108 in such a manner that the position of the first imaging unit 106*a* in a direction parallel to the mounting surface 76*a* is substantially the same as the position of the second imaging unit 106*b* in this direction. That is, the upper surface of the test piece 1 and the lower surface of the test piece 1 at the same position can be imaged by the first imaging unit 106*a* and the second imaging unit 106*b*. The connecting portion 108 has such a shape that it does not interfere with the test piece holding mechanism 58 irrespective of the imaging position on the test piece 1 held on the test piece holding mechanism 58.

Referring back to FIG. 2, the processing apparatus 2 further includes a display portion 110 having a touch panel. The touch panel of the display portion 110 is adapted to be operated by an operator of the processing apparatus 2 in inputting conditions for processing to be performed in the processing apparatus 2. Further, the display portion 110 also has a function of displaying an alarm in the event that any abnormality has occurred during the processing operation, so that the operator can be informed of this alarm. Further, an alarm lamp 112 is provided on the upper surface of the rising portion 4*a* of the base housing 4 of the processing apparatus 2. For example, the alarm lamp 112 includes a green lamp and a red lamp. In this case, when the processing apparatus 2 is normally operated, the green lamp is lit, whereas when any abnormality has occurred in the processing apparatus 2, the red lamp is lit.

The operation of the inspecting apparatus 56 incorporated in the processing apparatus 2 will now be described, in which the test piece 1 is processed as a workpiece by the processing units 32 and next inspected by the inspecting apparatus 56. First, a cassette storing the frame unit 11 including the test piece 1 is mounted on the cassette support table 6 of the processing apparatus 2. Thereafter, the frame unit 11 is drawn from the cassette and transferred to the workpiece holding unit 14 by operating the transfer unit 16. Thereafter, the test piece 1 of the frame unit 11 held on the workpiece holding unit 14 is processed by the processing units 32. Thereafter, the frame unit 11 is transferred to the cleaning apparatus 40 by operating the transfer unit 42 and the test piece 1 is next cleaned by the cleaning apparatus 40.

Thereafter, the frame unit 11 is transferred from the cleaning apparatus 40 to the test piece holding mechanism 58 of the inspecting apparatus 56 by operating the transfer unit 42. Thereafter, the vacuum source connected to the suction groove 78a formed in the tape holding portion 78 is operated to hold the frame unit 11 on the test piece holding mechanism 58 under suction. Thereafter, the moving units 64a and 64b are operated to relatively move the test piece holding mechanism 58 and the imaging mechanism 82 so that the horizontal position of the first and second imaging units 106a and 106b comes into coincidence with any inspecting position on the test piece 1. Thereafter, the elevating mechanisms 96a and 96b are operated to set focal points of the first and second imaging units 106a and 106b on the upper and lower surfaces of the test piece 1, respectively.

FIG. 7 is a schematic sectional view depicting a positional relation among the test piece holding mechanism 58, the imaging mechanism 82, and the test piece 1 in inspecting the test piece 1 held on the test piece holding mechanism 58 by using the imaging mechanism 82. The front side 1a (upper surface) of the test piece 1 and the back side 1b (lower surface) of the test piece 1 at the same horizontal position can be imaged by the first and second imaging units 106a and 106b of the imaging mechanism 82, respectively. The imaging mechanism 82 can be relatively moved with respect to the test piece holding mechanism 58 by operating the X moving unit 64a and the Y moving unit 64b. Accordingly, the imaging mechanism 82 can simultaneously image the upper and lower surfaces of the test piece 1 at the same horizontal position which can be arbitrarily set. However, the imaging mechanism 82 is not always required to simultaneously image the upper and lower surfaces of the test piece 1, but the timing of imaging the upper surface of the test piece 1 by using the first imaging unit 106a may be different from the timing of imaging the lower surface of the test piece 1 by using the second imaging unit 106b. Further, only one of the imaging units 106a and 106b may be operated.

In the case that the test piece 1 is cut by the processing units 32 of the processing apparatus 2 to form a cut groove as a processed mark 3a along each street 3 as depicted in FIG. 7, the inspecting apparatus 56 can observe the processed mark 3a from the upper and lower surfaces of the test piece 1 at the same position. Accordingly, the size of chipping formed along the processed mark 3a can be measured, and the size of each device chip formed by dividing the test piece 1 can also be measured. After imaging the test piece 1 to inspect the same, the frame unit 11 including the test piece 1 is returned to the cassette supported on the cassette support table 6 by operating the transfer unit 42 and the transfer unit 16.

In the case of inspecting the test piece 1 processed to determine whether or not the processing performed to the test piece 1 is acceptable, there is a case that it is insufficient to image only the front side 1a (upper surface) of the test piece 1 and next observe an image obtained. In the case of conventionally imaging both the front side 1a (upper surface) and the back side 1b (lower surface) of the test piece 1 at the same position on the test piece 1, the test piece 1 must be inverted after imaging the front side 1a of the test piece 1, for example. Furthermore, in next imaging the back side 1b of the test piece 1 at the same position, the imaging unit must be precisely set at the same position. Accordingly, much time and effort are required to invert the test piece 1 and next precisely set the relative position of the imaging unit with respect to the test piece 1. In addition, there is a possibility that the poisoning of the imaging unit may come to a failure. To the contrary, the inspecting apparatus 56 according to the preferred embodiment includes the imaging mechanism 82 having the first imaging unit 106a, the second imaging unit 106b, and the connecting portion 108 for connecting the first and second imaging units 106a and 106b. Accordingly, the upper surface and the lower surface of the test piece 1 can be imaged at the same position. As a result, time and effort conventionally required can be suppressed and there is no possibility that the positioning of the imaging unit may come to a failure.

The processing apparatus 2 incorporating the inspecting apparatus 56 according to the preferred embodiment may include a control unit for controlling each component. In this case, the control unit may control the inspecting apparatus 56 to image the upper and lower surfaces of the test piece 1, thereby perform the inspection of the test piece 1, and further determine whether or not the processing performed to the test piece 1 is acceptable. In the case that the control unit determines that the processing performed to the test piece 1 is not acceptable, the control unit may operate the display portion 110 or the alarm lamp 112 to inform the operator of this result of determination.

Further, in transferring the test piece 1 from the cleaning table of the cleaning apparatus 40 to the inspecting apparatus 56, the control unit may adjust the orientation of the cleaning table before holding the test piece 1 by using the transfer unit 16 or 42, so that the orientation of the test piece 1 to be held on the test piece holding mechanism 58 can be controlled. In this case, the control unit may totally record the processing position on the test piece 1 and the imaging position on the image of the test piece 1 as obtained by the inspecting apparatus 56.

For example, in the event that any abnormality on the processing performed to the test piece 1 is recognized from the image obtained by the inspecting apparatus 56, the position where the abnormality has occurred on the test piece 1 can be specified. Accordingly, the cause of the abnormality can be diversely analyzed. Further, in the case that the image obtained by the inspecting apparatus 56, the inspected position on the test piece 1 as observed on the image, and the processing position on the test piece 1 are recorded in the control unit, the above analysis can be performed with any timing.

The present invention is not limited to the preferred embodiment, and various modifications may be made. For example, while the test piece 1 is supported through the adhesive tape 7 to the ring frame 9 in the preferred embodiment, the test piece 1 that can be inspected by the inspecting apparatus 56 is not limited to such a configuration. That is, the test piece 1 may not be supported through the adhesive tape 7 to the ring frame 9. Further, while the test piece 1 processed by the processing units 32 of the processing apparatus 2 is imaged by the inspecting apparatus 56 in the above preferred embodiment, the test piece 1 usable in the present invention is not limited to such a configuration. That is, the test piece 1 to be inspected may be processed by any processing apparatus other than the processing apparatus 2 depicted in FIG. 2. Further, the test piece 1 to be inspected may not be processed. Further, the inspecting apparatus may not be incorporated in the processing apparatus 2, but may be an independent apparatus. Further, the inspecting apparatus 56 may perform only imaging of the test piece 1. In this case, the inspection of the test piece 1 by the use of an image obtained by the inspecting apparatus 56 may be performed by any other apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for processing a workpiece attached to a transparent adhesive tape and supported through said adhesive tape to a ring frame, said processing apparatus comprising:
   a workpiece holding unit for holding said workpiece;
   a processing unit for processing said workpiece held by said workpiece holding unit;
   an inspecting apparatus for inspecting said workpiece processed by said processing unit; and
   a transfer unit for transferring said workpiece from said workpiece holding unit to said inspecting apparatus, wherein
   said inspecting apparatus includes
      a workpiece holding mechanism for holding said workpiece, said workpiece holding mechanism having a mounting portion formed from a transparent member having upper and lower exposed surfaces, said upper exposed surface of said transparent member functioning as a mounting surface for mounting said workpiece through said adhesive tape, whereby said workpiece mounted on said mounting surface of said mounting portion through said adhesive tape is adapted to be held by said workpiece holding mechanism,
      an imaging mechanism for imaging said workpiece held by said workpiece holding mechanism, said imaging mechanism having a first imaging unit provided above said mounting portion, a second imaging unit provided below said mounting portion, and a connecting portion for connecting said first imaging unit and said second imaging unit, and
      a moving unit for relatively moving said imaging mechanism with respect to said mounting portion in a direction parallel to said mounting surface,
   said first imaging unit of said imaging mechanism is adapted to image the upper surface of said workpiece mounted on said mounting surface of said mounting portion and held by said workpiece holding mechanism,
   said second imaging unit of said imaging mechanism is adapted to image the lower surface of said workpiece mounted on said mounting surface of said mounting portion and held by said workpiece holding mechanism, and
   said first imaging unit and said second imaging unit are adapted to image the upper surface and the lower surface of said workpiece at a same position in said direction parallel to said mounting surface.

2. The processing apparatus according to claim 1, wherein said workpiece holding mechanism further has:
   a tape holding portion having a tape holding surface for holding said adhesive tape under suction, said tape holding surface being formed around an outer circumference of said mounting portion, said adhesive tape being held under suction in an annular area defined between an outer circumference of said workpiece mounted on said mounting surface and an inner circumference of said ring frame; and
   a frame supporting portion provided around said tape holding portion for supporting said ring frame.

3. The processing apparatus according to claim 2, wherein a height of said mounting surface of said mounting portion is lower than a height of said tape holding surface of said tape holding portion.

4. The processing apparatus according to claim 1, wherein said mounting surface of said mounting portion is coated with fluororesin.

5. An inspecting apparatus for inspecting a test piece, the inspecting apparatus comprising:
   a test piece holding mechanism for holding a test piece attached to a transparent adhesive tape, the adhesive tape being attached to a ring frame with the test piece being positioned within an inner opening defined by the ring frame, the holding mechanism having a mounting portion formed from a transparent member having first and second surfaces, the first surface of the transparent member functioning as a mounting surface on which the test piece through the adhesive tape is held to the test piece holding mechanism;
   an imaging mechanism for imaging the test piece held by the test piece holding mechanism, the imaging mechanism having a first imaging unit positioned to a first side of the mounting portion, a second imaging unit positioned to a second, opposing side of the mounting portion, and a connecting portion physically connecting the first imaging unit and the second imaging unit and maintaining their relative positons with respect to each other in a plane parallel to the mounting surface; and
   a moving unit for relatively moving the imaging mechanism with respect to the mounting portion in a linear direction parallel to the mounting surface, wherein
   the first imaging unit of the imaging mechanism is adapted to image a first surface of the test piece mounted on the mounting surface of the mounting portion and held by the test piece holding mechanism,
   the second imaging unit of the imaging mechanism is adapted to image a second, opposing surface of the test piece mounted on the mounting surface of the mounting portion and held by the test piece holding mechanism, and
   the first imaging unit and the second imaging unit are adapted to image the first surface and the second surface of the test piece at a same position in the direction parallel to the mounting surface.

6. The inspecting apparatus according to claim 5, wherein said mounting surface of said mounting portion is coated with fluororesin.

7. The inspecting apparatus of claim 5 wherein the mounting portion is made of transparent glass or resin and wherein the mounting surface is round.

8. The inspecting apparatus of claim 7 wherein the holding mechanism further comprises an annular frame supporting portion having an annular tape holding portion adjacent an inner opening defined by the annular frame supporting portion, and
   wherein the round mounting surface is positioned within the inner opening defined by the annular frame supporting portion.

9. The inspecting apparatus of claim 8 wherein in use, the ring frame contacts the annular frame supporting portion and the test piece attached to the adhesive tape is positioned on the mounting surface and drawn into contact with the mounting surface via suction applied to the tape by a suction portion of the tape holding portion.

10. The inspecting apparatus of claim 8 wherein the mounting surface is positioned horizontally and wherein the mounting surface is positioned lower than the tape holding surface.

11. An inspecting method for inspecting a test piece using an inspecting apparatus, the method comprising:
- positioning a test piece on a test piece holding mechanism, the test piece attached to a transparent adhesive tape, the adhesive tape being attached to a ring frame with the test piece being positioned within an inner opening defined by the ring frame, the holding mechanism having a mounting portion formed from a transparent member having first and second surfaces, the first surface of the transparent member functioning as a mounting surface on which the test piece through the adhesive tape is held to the test piece holding mechanism;
- imaging the test piece held by the test piece holding mechanism using an imaging mechanism, the imaging mechanism having a first imaging unit positioned to a first side of the mounting portion, a second imaging unit positioned to a second, opposing side of the mounting portion, and a connecting portion physically connecting the first imaging unit and the second imaging unit and maintaining their relative positons with respect to each other in a plane parallel to the mounting surface; and
- relatively moving the imaging mechanism with respect to the mounting portion in a linear direction parallel to the mounting surface, wherein
- the first imaging unit images a first surface of the test piece mounted on the mounting surface of the mounting portion and held by the test piece holding mechanism,
- the second imaging unit images a second, opposing surface of the test piece mounted on the mounting surface of the mounting portion and held by the test piece holding mechanism, and
- the first imaging unit and the second imaging unit image the first surface and the second surface of the test piece at a same position in the direction parallel to the mounting surface.

12. The method of claim 11 wherein the mounting portion is made of transparent glass or resin and wherein the mounting surface is round.

13. The method of claim 12 wherein the holding mechanism further comprises an annular frame supporting portion having an annular tape holding portion adjacent an inner opening defined by the annular frame supporting portion, and
- wherein the round mounting surface is positioned within the inner opening defined by the annular frame supporting portion; and wherein
- the act of positioning the test piece on a test piece holding mechanism comprises positioning the ring frame adjacent the annular frame supporting portion while the test piece through the adhesive tape is positioned adjacent the mounting surface.

14. The method of claim 13 wherein the annular tape holding portion comprises an annular suction portion communicatively connected to a vacuum source, the method further comprising:
- operating the vacuum source to create suction by the annular suction portion whereby a portion of the adhesive tape on which the test piece is attached is drawn into contact with the mounting surface.

15. The method of claim 14 wherein the mounting surface is positioned horizontally and wherein the mounting surface is positioned lower than the tape holding surface.

16. The method of claim 15 wherein the test piece is wafer having a plurality of devices formed thereon.

17. The method of claim 11 wherein the test piece is wafer having a plurality of devices formed thereon.

18. The method of claim 11 wherein the test piece is held in a non-rotational manner by the test piece holding mechanism while relatively moving the imaging mechanism with respect to the mounting portion in a linear direction parallel to the mounting surface.

19. The inspecting apparatus of claim 5 wherein the test piece holding mechanism holds the test piece in a non-rotational manner by the while moving unit relatively moves the imaging mechanism with respect to the mounting portion in a linear direction parallel to the mounting surface.

\* \* \* \* \*